United States Patent
Hung et al.

(10) Patent No.: US 9,881,677 B1
(45) Date of Patent: Jan. 30, 2018

(54) SENSE AMPLIFIER AND METHOD FOR BIT LINE VOLTAGE COMPENSATION THEREOF

(71) Applicant: MACRONIX International Co., Ltd., Hsinchu (TW)

(72) Inventors: Ji-Yu Hung, Hsinchu (TW); Kai-Hsiang Chiang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/498,369

(22) Filed: Apr. 26, 2017

(51) Int. Cl.
*G11C 16/06* (2006.01)
*G11C 16/24* (2006.01)
*G11C 16/28* (2006.01)
*G11C 16/10* (2006.01)

(52) U.S. Cl.
CPC .............. *G11C 16/24* (2013.01); *G11C 16/10* (2013.01); *G11C 16/28* (2013.01)

(58) Field of Classification Search
CPC .. G11C 11/1673; G11C 11/1655; G11C 7/065
See application file for complete search history.

(56) References Cited

U.S. PATENT DOCUMENTS

| | | | |
|---|---|---|---|
| 9,697,880 B2* | 7/2017 | Andre | G11C 11/1675 |
| 2013/0100740 A1 | 4/2013 | She et al. | |
| 2013/0128658 A1* | 5/2013 | Alam | G11C 11/16 365/158 |
| 2013/0128667 A1* | 5/2013 | Lee | G11C 16/10 365/185.11 |
| 2013/0250687 A1 | 9/2013 | Chan | |
| 2013/0272060 A1* | 10/2013 | Andre | G11C 11/1673 365/158 |
| 2014/0003157 A1 | 1/2014 | Mui et al. | |
| 2016/0189777 A1 | 6/2016 | Yoshihara et al. | |
| 2016/0267981 A1 | 9/2016 | Hioka | |

* cited by examiner

*Primary Examiner* — Tuan T Nguyen
(74) *Attorney, Agent, or Firm* — J.C. PATENTS

(57) ABSTRACT

A sensing amplifier includes a first bit line driver, a second bit line driver and a third bit line driver. The first bit line driver sets a first bit line for a fast-pass-write (FPW) operation. The second bit line driver sets a second bit line for a first operation rather than the FPW operation. The third bit line driver sets a third bit line for a second operation rather than the FPW operation. The first bit line is arranged between the second bit line and the third bit line, and the second bit line driver and the third bit line driver respectively adjust voltage statuses of the second bit line and the third bit line to rise a voltage level of the first bit line by a compensated level.

20 Claims, 9 Drawing Sheets

US 9,881,677 B1

SENSE AMPLIFIER AND METHOD FOR BIT LINE VOLTAGE COMPENSATION THEREOF

BACKGROUND

Field of the Invention

The invention relates to a sense amplifier and a method for bit line voltage compensation thereof. Particularly, the invention relates the method for compensating a voltage a fast-pass-write bit line by the sense amplifier.

Description of Related Art

In a non-volatile memory, parasitic capacitors with large capacitance exist between bit lines. Longer charge/discharge time for setting a voltage level at the bit line is therefore necessary. Especially in fast-pass-write (FPW) operation, bit lines may be operated under inhibited (floating bias), programmed or FPW programmed. As has been discussed in aforementioned operations, loads between bit lines are different. In conventional art, a voltage level on the bit line with FPW operation may not be set on an appropriate voltage level, and efficiency of the FPW operation may be reduced.

SUMMARY OF THE INVENTION

The invention is directed to a sensing amplifier and a method for bit line voltage compensation thereof, which can compensate a voltage on a fast-pass-write bit line.

The invention provides the sensing amplifier including a first bit line driver and a second bit line driver. The first bit line driver is coupled to a first bit line, and sets the first bit line for a fast-pass-write (FPW) operation. The second bit line driver is coupled to a second bit line, and sets the second bit line for a program operation. The first bit line is arranged adjacent to the second bit line, and the second bit line driver adjusts voltage level of the second bit line to rise a voltage level of the first bit line by a compensated level.

The invention provides the method for bit line voltage compensation including: setting a first bit line for a fast-pass-write (FPW) operation; setting a second bit line for a program operation; and, respectively adjusting a voltage level of the second bit line during the FPW operation. Wherein, the first bit line is arranged adjacent to the second bit line.

According to the above descriptions, in the invention, the sense amplifier of the invention provides a plurality of bit line drivers. If a first bit line is the FPW bit line, the bit line driver of bit line adjacent to the first bit line adjust voltage level of the adjacent bit line for compensation the voltage on the FPW bit line by capacitive coupling effect.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
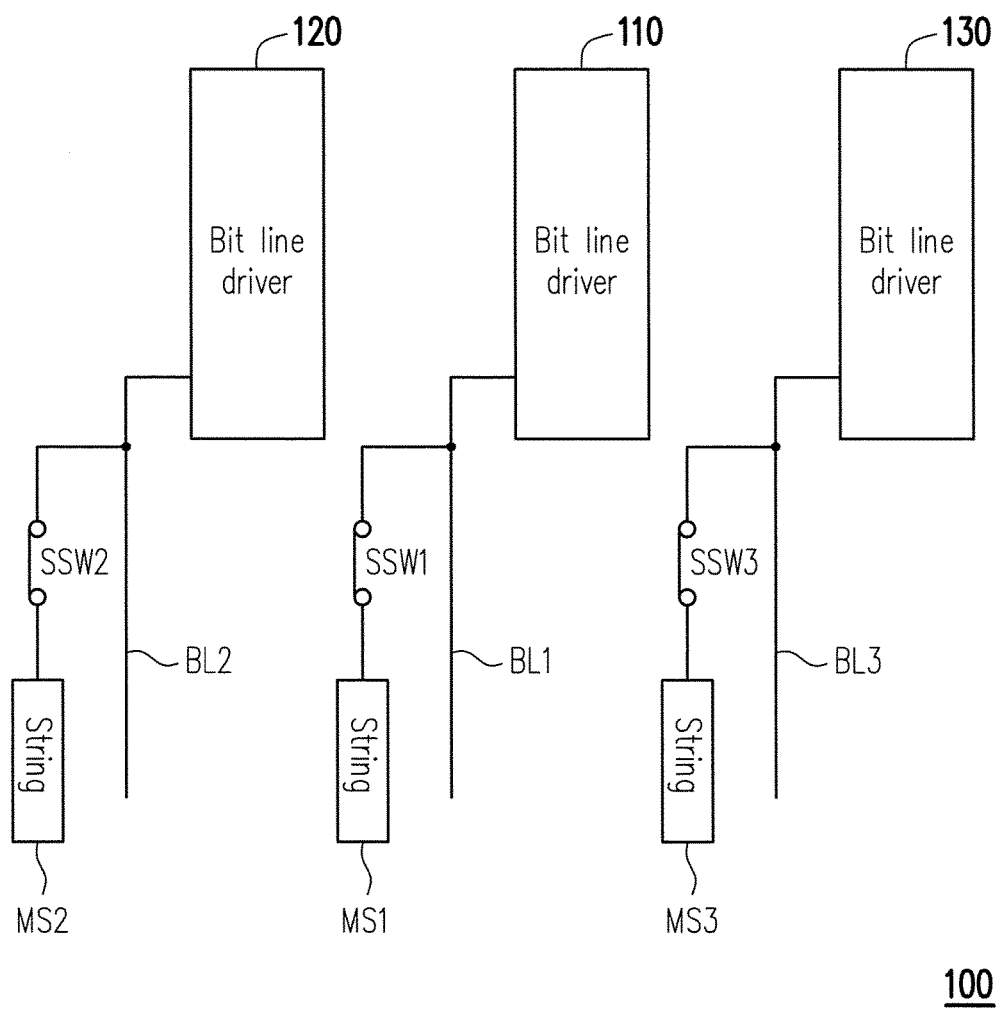
FIG. 1 illustrates a schematic diagram of a sense amplifier for a non-volatile memory according to an embodiment of present disclosure.

Referring to FIG. 1, FIG. 1 illustrates a schematic diagram of a sense amplifier for a non-volatile memory according to an embodiment of present disclosure. The sense amplifier 100 includes a plurality of bit line drivers 110-130. The bit line drivers 110-130 are respectively coupled to a plurality of bit lines BL1-BL3. The bit lines BL1-BL3 are respectively coupled to a plurality of strings MS1-MS3 through a plurality of string selecting switches SSW1-SSW3, respectively. The bit line drivers 110-130 may respectively adjust voltage statuses on the bit lines BL1-BL3. Take the bit line driver 110 as an example, the bit line driver 110 may increase the voltage level on the bit line BL1, reduce the voltage level on the bit line BL1, or float the bit line BL1. Herein, the non-volatile memory may be, but not limited to, a NAND flash memory.

In this embodiment, the bit line BL1 is arranged between the bit lines BL2 and BL3 in the non-volatile memory, and voltage variations on the bit lines BL2 and BL3 may be coupled to the bit line BL1 through parasitic capacitances between the bit lines BL1 and BL2 and between the bit lines BL1 and BL3.

Figure 2A:
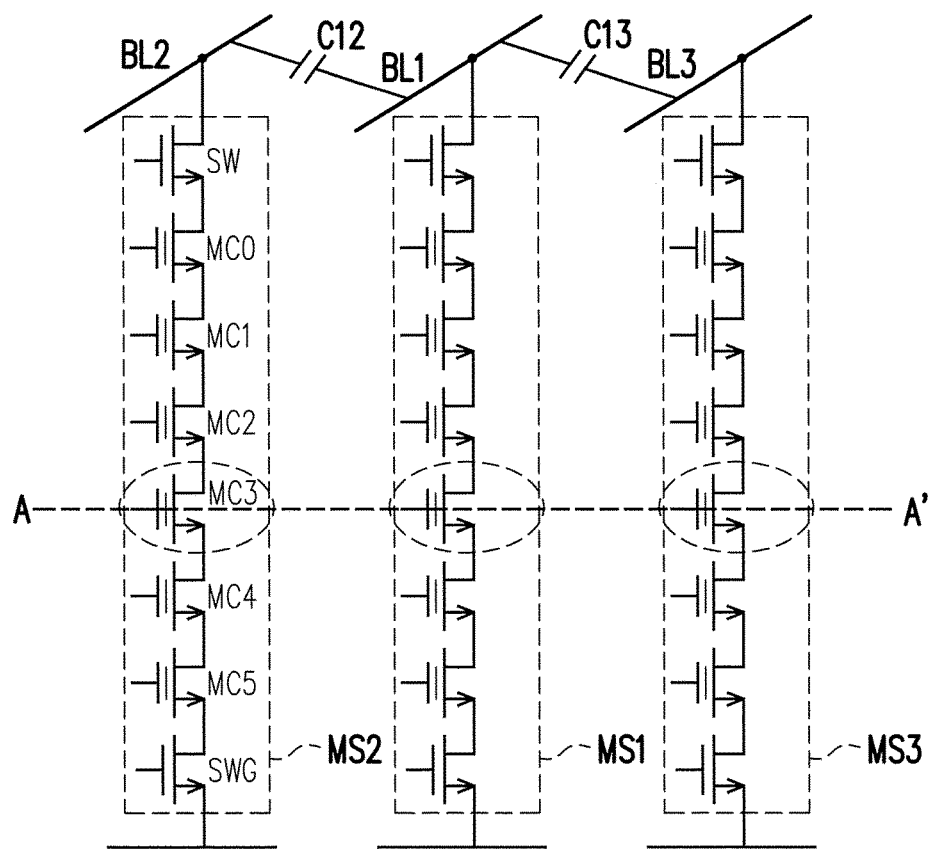
FIG. 2A illustrates a schematic diagram of a plurality adjacent bit line in the non-volatile memory according to an embodiment of present disclosure.
Figure 2B:
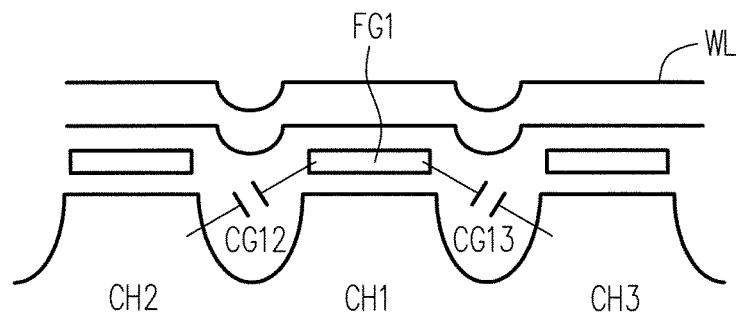
FIG. 2B illustrates a cross section of the non-volatile memory according to an embodiment of present disclosure.

Referring to FIGS. 2A and 2B. FIG. 2A illustrates a schematic diagram of a plurality of adjacent bit lines in the non-volatile memory according to an embodiment of present disclosure, and FIG. 2B illustrates a cross section along line A-A' of FIG. 2A in the non-volatile memory according to an embodiment of present disclosure. In FIG. 2A, three memory stings MS1-MS3 are illustrated, and the memory strings MS1-MS3 are respectively coupled to the bit lines BL1-BL3. Take the memory string MS2 as an example. The memory string MS2 includes a transistor switch SW, a plurality of memory cells MC1-MC5 and another transistor switch SWG which are coupled in series. There is a parasitic capacitor C12 coupled between the bit lines BL1 and BL2, and there is another parasitic capacitor C13 coupled between the bit lines BL1 and BL3. Furthermore, in FIG. 2B, there is a parasitic capacitor CG12 between a floating gate FG1 on a channel CH1 tied to the bit line BL1 and a channel CH2 tied to the bit line BL2, and there is another parasitic capacitor CG13 between the floating gate FG1 and a channel CH3 tied to the bit line BL3.

Referring to FIGS. 1, 2A and 2B again, commonly, during a fast-pass-write (FPW) operation, the bit line BL1 may be selected to be a FPW bit line for the FPW operation, and each of the bit lines BL1 and BL3 may be selected to be a programmed bit line or an inhibited bit line. Different loads can be occurred on the bit line BL1 according to different voltage statuses on the bit lines BL2 and BL3.

In a first case of present disclosure, one of the bit lines BL1 and BL3 is selected to be the programmed bit line for programming operation. For example, if the bit line BL3 is the programmed bit line, a voltage on the bit line BL3 is fixed to a reference voltage at a start time of the FPW operation, and a middle load equals to a capacitance of the capacitors C13 and CG13 coupled in parallel loaded on the FPW bit line (the bit line BL1). Such as that, for setting the voltage on the bit line BL1 to an appropriate voltage for FPW operation, the bit line driver 130 may adjust the voltage status on the bit line BL3 by rising the voltage on the bit line BL3 by a compensation voltage. The voltage on the bit line BL1 can be raised by coupling the increased compensation voltage on the bit line BL3, and the voltage on the bit line BL1 may close to the appropriate voltage.

In a second case of present disclosure, if one of the bit lines BL1 and BL3 is selected to be the programmed bit line for programming operation, and the other one is selected to be the programmed bit line or the inhibited bit line. Both of the bit lines BL1 and BL3 may be respectively applied two fixed reference voltages when the start time of the FPW operation is applied on the bit line BL1, and the capacitance on the bit line BL1 equals to the capacitance of the capacitors C12, C13, CG12 and CG13 coupled in parallel. That is, a heavy load is demanded on the FPW bit line (the bit line BL1) for the FPW operation. In this case, if both of the bit lines BL2 and BL3 are the programmed bit lines, the bit line drivers 120 and 130 respectively adjust the voltage statuses on the bit line BL2 and BL3 by increasing voltages on the bit lines BL2 and BL3 by the compensation voltage during the FPW operation. If the bit line BL2 is the programmed bit line and the bit line BL3 is the inhibited bit line, the bit line driver 120 may adjust the voltage statuses on the bit line BL2 by increasing voltage level on the bit line BL2 by the compensation voltage during the FPW operation.

Such as that, the voltage level on the bit line BL1 can be further raised by coupling the raised compensation voltage on the bit lines BL2 and BL3, and the voltage level on the bit line BL1 may close to the appropriate voltage for the FPW operation.

In the second case of present disclosure, for example, if the bit line BL2 is selected to be the inhibited bit line, and the bit line BL3 is selected to the programmed bit line. For reducing the load on the bit line BL2 during the FPW operation, the bit line driver 120 can further adjust the voltage status on the bit line BL2 by floating the bit line BL2 during the FPW operation. Since the bit line BL2 is floated, the capacitances on the bit line BL1 contributed by the capacitance CG12 and C12 are reduced due to arrangement in series. Then, the bit line driver 130 may adjust the voltage on the bit line BL3 by rising the voltage on the bit line BL3 by the compensation voltage. Such as that, the voltage level on the bit line BL1 can be raised by coupling the raised compensation voltage on the bit line BL3, and the voltage on the bit line BL1 may close to the appropriate voltage for the FPW operation.

In a third case of present disclosure, if both of the bit lines BL2 and BL3 are inhibited bit lines, the bit line drivers 120 and 130 may adjust the voltage statuses of the bit lines BL2 and BL3 by floating the bit lines BL2 and BL3. In this case, the load on the bit line BL1 becomes a lightly load by floating the bit lines BL2 and BL3 such that the equivalent capacitors C12 and C13 are connected in series with each other, and the FPW operation can be operated well on the bit line BL1.

Figure 3:
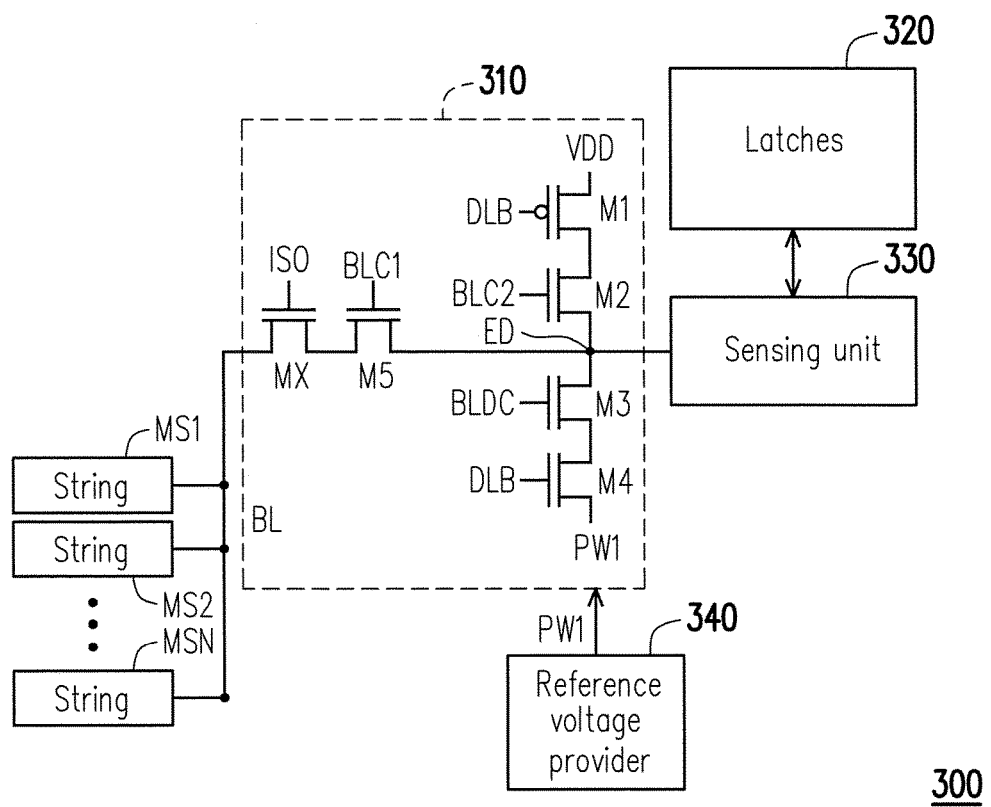
FIG. 3 illustrates a schematic diagram of a sense amplifier according to an embodiment of present disclosure.

Referring to FIG. 3, FIG. 3 illustrates a schematic diagram of a sense amplifier according to an embodiment of present disclosure. The sense amplifier 300 includes a bit line driver 310, a sensing circuit 330, a plurality of latches 320, and a reference voltage provider 340. The bit line driver 310 is coupled to a bit line BL which coupled to a plurality of strings MS1-MSN. The bit line driver 310 includes data controlled switches M1 and M4, a bit line clamper M5, an isolated switch MX, a bit line controlled switches M2 and a bypass switch M3. The data controlled switches M1 is coupled between a first voltage VDD and the bit line controlled switch M2, and controlled by a data signal DLB. The first voltage VDD may be an operation voltage of the sense amplifier 300. The bit line controlled switch M2 is coupled between the data controlled switches M1 and an end ED, and controlled by a bit line control signal BLC2. The bit line clamper M5 is coupled between the end ED and the isolation switch MX, and controller by another bit line control signal BLC1. The bypass switch M3 is coupled between the end ED and the data controlled switch M4, and controlled by a pass control signal BLDC. The data controlled switch M4 is coupled between the bypass switch M3 and a reference voltage PW1, and controlled by the data signal DLB. Furthermore, the isolation switch MX is coupled between the bit line BL and the bit line clamper M5, and controlled by an isolation signal ISO. The reference voltage provider 340 is coupled to the bit line driver 310 for providing the reference voltage PW1.

The sensing circuit 330 may include a transistor (not shown). During program operation, the transistor of the sensing circuit 330 can be turned OFF such that the latches 320 are isolated from the bit line driver 310. The latches can be therefore used to execute another process such as parallel data processing.

The bit line driver 310 may pull up the voltage on the bit line BL according to the first voltage VDD by turning on the isolation switch MX, the bit line clamper M5, the data controlled switch M1 and the bit line controlled switch M2, and cutting off at least one of the data controlled switch M4 and the bypass switch M3. The bit line driver 310 may pull down the voltage on the bit line BL according to the reference voltage PW1 by turning on the isolation switch MX, the bit line clamper M5, the data controlled switch M4 and the bypass switch M3, and cutting off the data controlled switch M1. The bit line driver 310 may also float the bit line by cutting off the bit line clamper M5.

In this embodiment, all of the data controlled switches M1 and M4, the bit line clamper M5, the isolated switch MX, the bit line controlled switches M2 and the bypass switch M3 may be formed by transistors. The data controlled switches M1 may be a P-type transistor, and the data controlled switch M4, the bit line clamper M5, the isolated switch MX, the bit line controlled switches M2 and the bypass switch M3 may be N-type transistors.

Figure 4A:
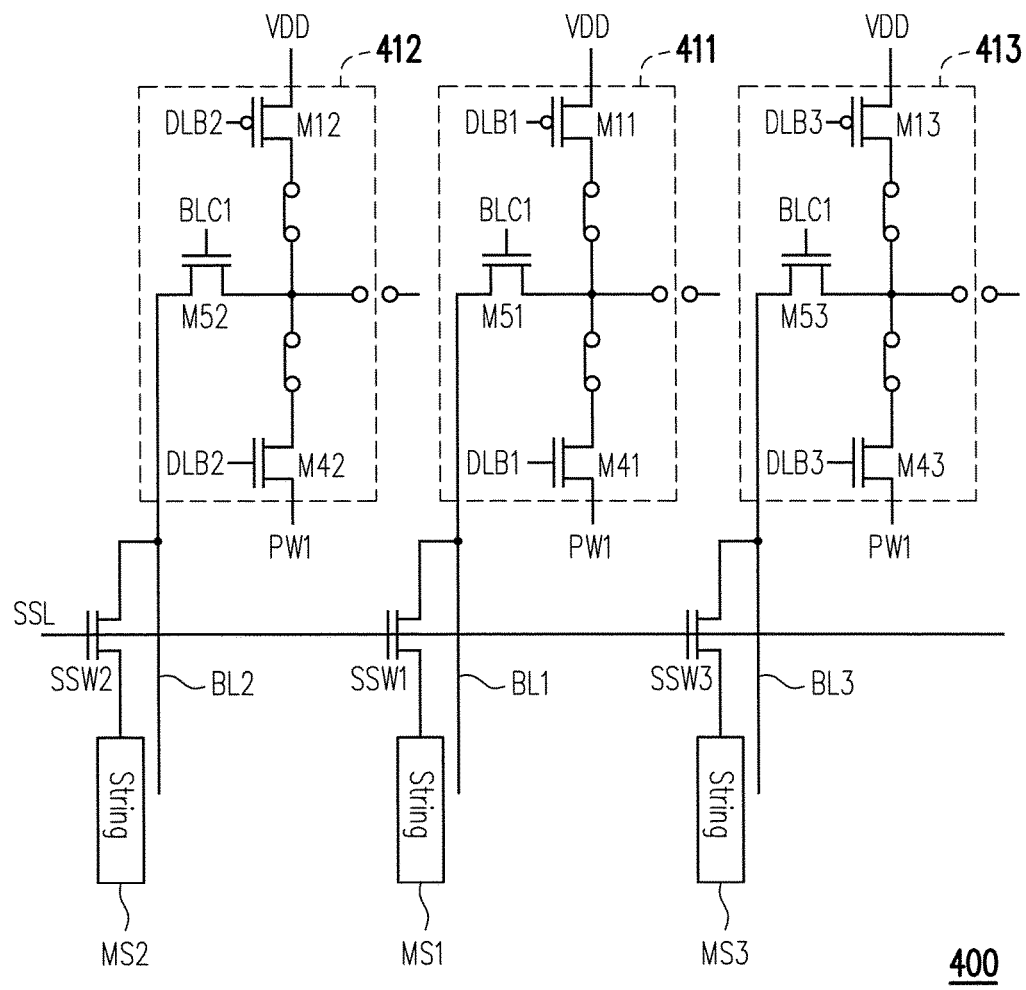
FIG. 4A illustrates a schematic diagram of a sense amplifier according an embodiment of present disclosure.
Figure 4B:
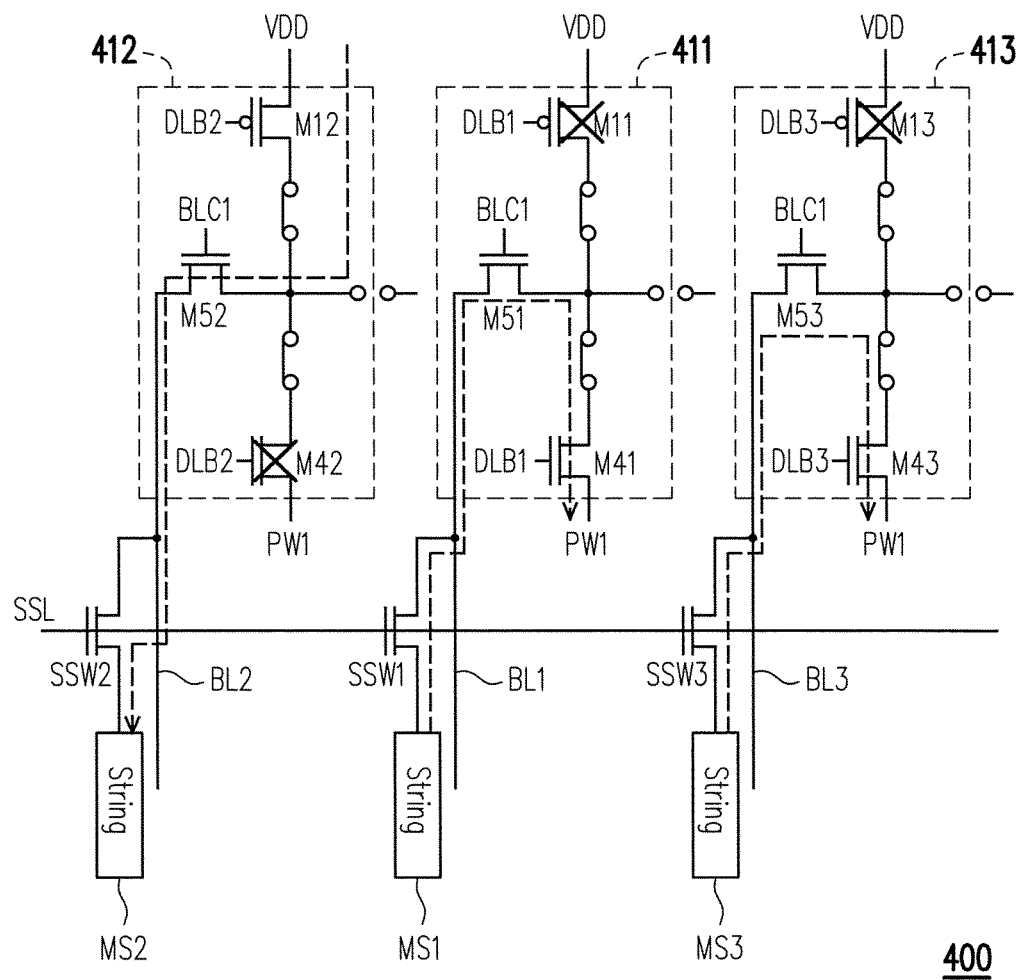
FIG. 4B-FIG. 4D illustrate operation diagrams of the sense amplifier in FIG. 4A of present disclosure.
Figure 4C:
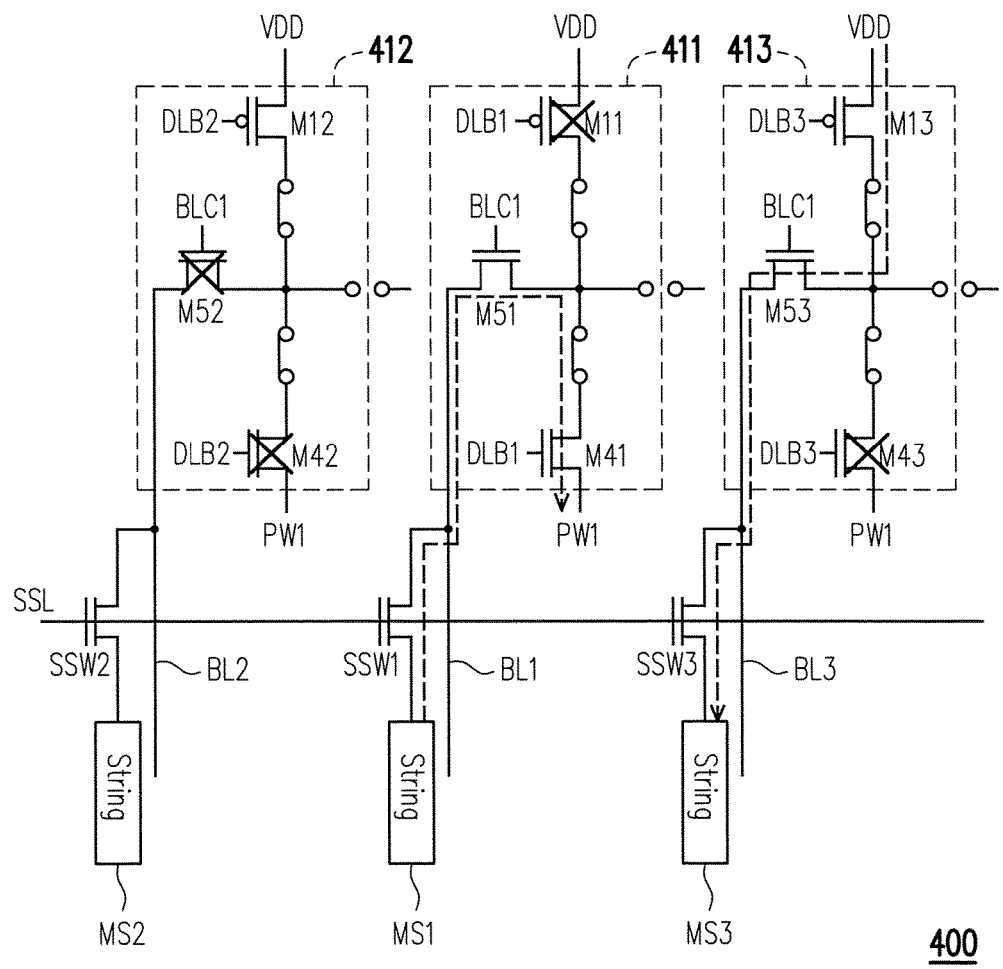
Figure 4D:
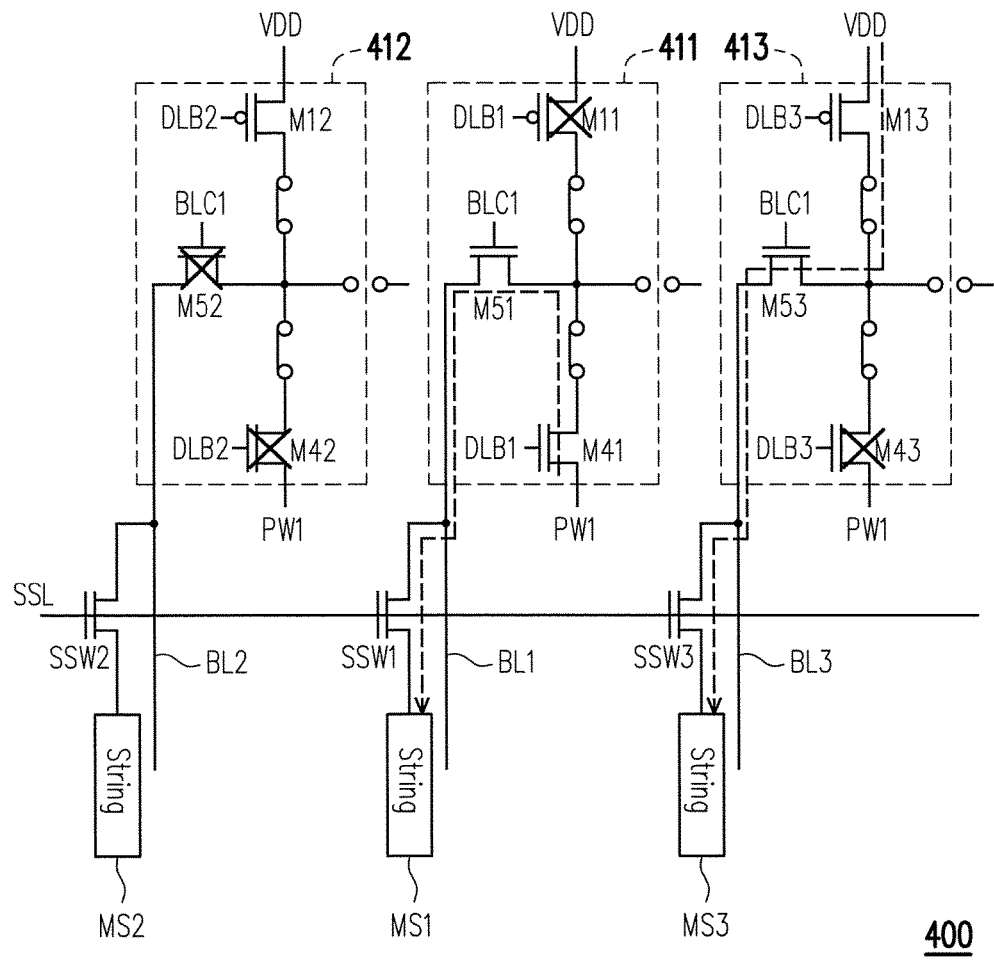
Figure 5:
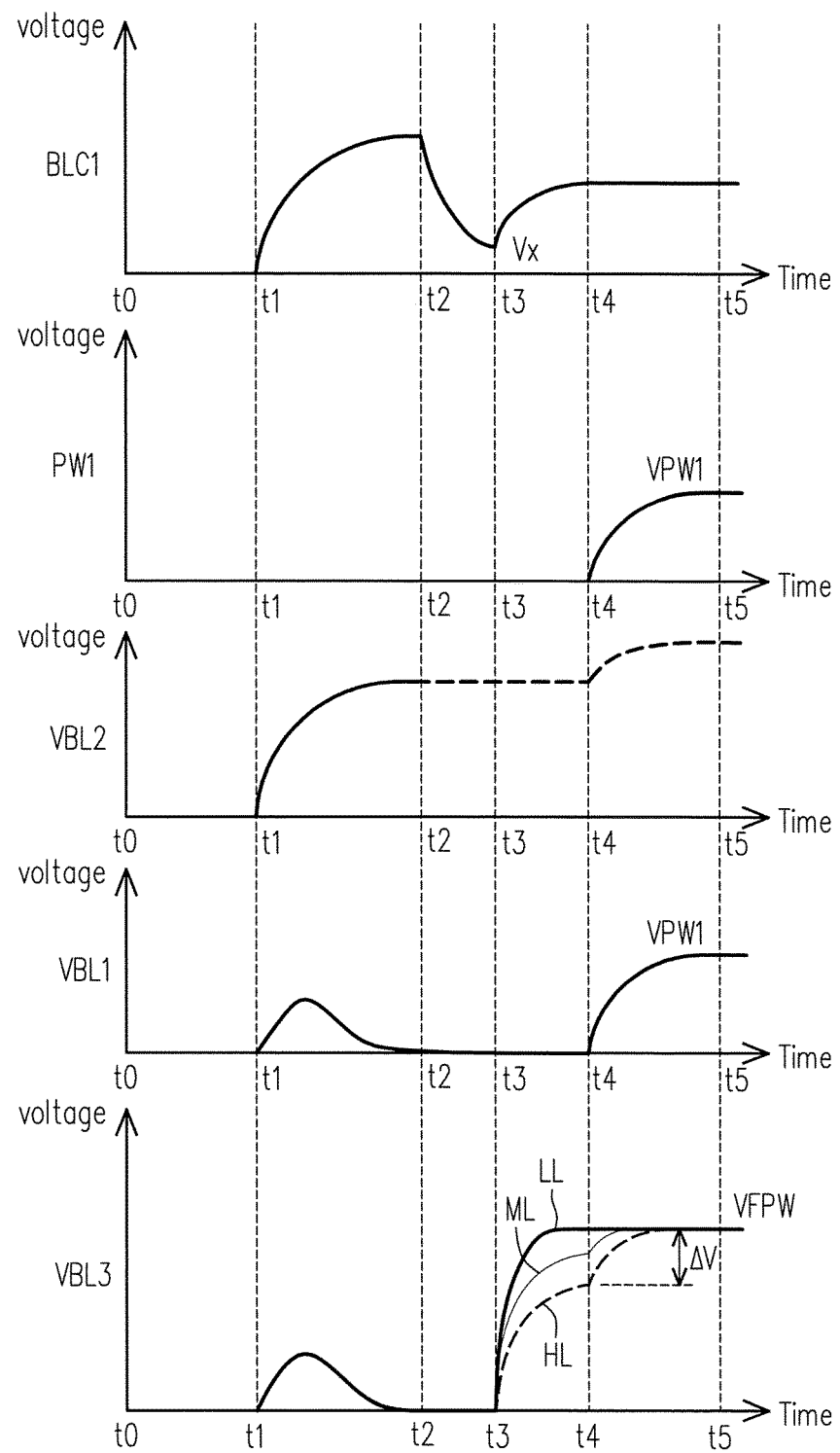
FIG. 5 illustrates waveform diagram of the sense amplifier according an embodiment of present disclosure.

Referring to FIG. 4A-FIG. 4D and FIG. 5, the detailed operations of the sense amplifier 300 are described. FIG. 4A illustrates a schematic diagram of a sense amplifier according an embodiment of present disclosure, FIG. 4B-FIG. 4D illustrate operation diagrams of the sense amplifier in FIG. 4A of present disclosure, and FIG. 5 illustrates waveform diagram of the sense amplifier according an embodiment of present disclosure. In this embodiment, please refer to FIG. 4A again, three bit line drivers 411-413 operate different operations on the bit lines BL1-BL3, respectively. In the bit line drivers 411-413, the bypass switches, the bit line controlled switches and the isolation switches are always turned on during the operations. The bit line driver 411 includes data controlled switches M11 and M41 controlled by the data signal DLB1, and a bit line clamper M51 controlled by a bit line control signal BLC1. The bit line driver 412 includes data controlled switches M12 and M42 controlled by the data signal DLB2, and a bit line clamper M52 controlled by a bit line control signal BLC1. The bit line driver 413 includes data controlled switches M13 and M43 controlled by the data signal DLB3, and a bit line clamper M53 controlled by a bit line control signal BLC1. The string selecting switches SSW1-SSW3 are controlled in response to a string selecting signal SSL.

Referring to FIGS. 4B-4D, in one embodiment, the bit line BL1 is selected to be the programmed bit line, the bit line BL2 is selected to be the inhibited bit line, and the bit line BL3 is selected to be the FPW bit line. Referring to FIG. 5, in an initial time period, during the time interval t0 to t1, all of voltages VBL1-VBL3 on the bit lines BL1-BL3 are kept at a low voltage (ex. 0V).

Still referring to FIGS. 4B and 5, in a first time period, during the time interval t1 to t2, the bit line clamper M51-M53 are fully turned on, while the bit line control signal BLC1 with relative high voltage level is applied, the data controlled switches M12, M41 and M43 are turned on respectively in response to the data signals DLB2, DLB1 and DLB3, and the data controlled switches M42, M11 and M13 are turned off respectively in response to the data signals DLB2, DLB1 and DLB3. In the first time period, the voltage VBL2 on the inhibited bit line (the bit line BL2) is pulled up toward the first voltage VDD by turning on the switches M12 and M52, and the voltage VBL2 on the bit line BL2 is charged to the first voltage VDD. The voltages VBL1 on the FPW bit line (the bit line BL3) and voltage VBL3 on the programmed bit line (the bit line BL1) are kept at the reference voltage PW1. During the first time period, the reference voltage PW1 may be kept at the low voltage, the ground voltage for instance.

Still referring to FIGS. 4C and 5, in a second time period, during the time interval t2 to t3, the bit line control signal BLC1 is decreased gradually to a threshold voltage Vx. At the time point t2, since two ends (source and drain ends) of the bit line clamper M52 have been charged to the first voltage VDD, the bit line clamper M52 is turned OFF because the voltage of the bit line control signal BLC1 is smaller than the voltage at the source end of switch 52. Therefore, the voltage status VBL2 on the inhibited line (the bit line BL2) is floated accordingly.

Also referring to FIG. 4C and FIG. 5, in a third time period, during the time interval t3 to t4, the data controlled switch M43 is turned OFF, and the data controlled switch M13 is turned ON in response to the data signal DLB3. At this time period, the voltage of the bit line control signal BLC1 is gradually increased during the third time period, and voltage VBL3 on the bit line BL3 is be increased for the FPW operation.

During the third time period, in one embodiment, the voltage of the bit line control signal VBLC1 equals to VFPW+Vth, wherein VFPW is a voltage level for FPW operation on the bit line BL3 and set to 0.6V for instance, and Vth is a threshold voltage of the transistor of the bit line clamper M53. Specifically, since there are different load demands on the FPW bit line (please see BL3 for instance), voltage curve of the voltage VBL3 on the bit line BL3 may be one of the curves LL, ML and HL.

In FIG. 5, the curves LL, ML and HL respectively correspond to the light load demand, the middle load demand, and the heavy load demand. The different load demands are decided by equivalent capacitance seen from one bit line which is operated under FPW. For the curves ML and HL shown in FIG. 5, they represent that the voltage on the bit line BL3 can't be charged to the predetermined voltage level VFPW under FPW operation during the third time period.

Still referring to FIGS. 4D and 5, during a fourth time period, during the time interval t4 to t5, the reference voltage PW1 is increased by a compensation voltage VPW1. In this embodiment, the compensation voltage VPW1 can be applied to the programmed bit line (the bit line BL1 for instance) through the data controlled switch M41 and the bit line clamper M51. Moreover, the compensation voltage VPW1 on the bit line BL1 may be coupled to the bit line BL3, and the voltage VBL3 on the bit lines BL3 are further increased to reach to the predetermined voltage VFPW under FPW operation, such that the charge speed of voltage VBL3 can be therefore increased during the fourth time period. Besides, since the voltage status on the bit line VBL2 is floated in the fourth time period, the voltage VBL2 on the bit line VBL2 is increased by the coupling effect of the compensation voltage VPW1 on the bit line BL1. The bit line BL2 can be inhibited better.

Specifically, a voltage level of the compensation voltage VPW1 is determined according to the appropriate voltage VFPW and a capacitance value between the FPW bit line and its adjacent bit line(s). For example, for heavy load demand shown in the curve HL of FIG. 5 during the fourth time period, the voltage VBL3 on the bit line BL3 can be further increased by a compensated level ΔV. In present embodiment, the compensated level ΔV=VFPW*a+ΣVPW1*CP, wherein a<1, CP is a coupling ratio between the FPW bit line and one adjacent programmed bit line, and the coupling ratio CP is determined according to the capacitance value between the FPW bit line and its adjacent bit line. In some embodiments, when there is a plurality of programmed bit lines adjacent to the FPW bit line, the summation operator (Σ) is needed.

Figure 6:
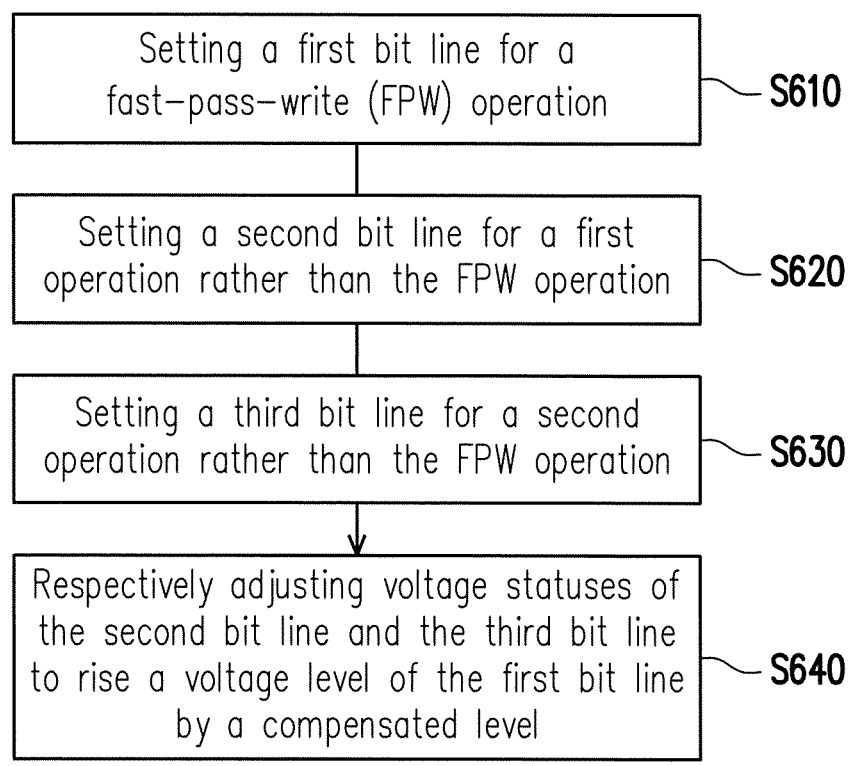
FIG. 6 illustrates a flow chart of a method for bit line voltage compensation according to an embodiment of present disclosure.

Referring to FIG. 6, FIG. 6 illustrates a flow chart of a method for bit line voltage compensation according to an embodiment of present disclosure. The step S610 is executed for setting a first bit line for a FPW operation. The step S620 is executed for setting a second bit line for a first operation rather than the FPW operation. The step S630 is executed for setting a third bit line for a second operation rather than the FPW operation. The step S640 is executed for respectively adjusting voltage statuses of the second bit line and the third bit line to rise a voltage level of the first bit line by a compensated level.

Herein, the step S610-S630 need not to be executed in sequence. Detail operation sequence of the step S610-S630 can be realized by referring to the embodiment of FIG. 4A-FIG. 4D and FIG. 5, and no more description is repeated here.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A sensing amplifier, adapted to a non-volatile memory, comprising:

a first bit line driver, coupled to a first bit line, setting the first bit line for a fast-pass-write (FPW) operation; and a second bit line driver, coupled to a second bit line, setting the second bit line for a program operation, wherein, the first bit line is arranged adjacent to the second bit line, and the second bit line driver adjusts voltage level of the second bit line during the FPW operation.

2. The sensing amplifier as claimed in claim 1, wherein if the second bit line driver setting the second bit line for the program operation, the second bit line driver adjusts the second bit line from a reference voltage to a compensation voltage during the FPW operation, wherein the compensation voltage is determined according to a capacitance value between the first bit line and the second and third bit lines.

3. The sensing amplifier as claimed in claim 1, further comprising:

a third bit line driver, coupled to a third bit line which is arranged adjacent to the second bit line, wherein if the third bit line driver sets an inhibited operation on the third bit line, the third bit line driver floats the third bit line and the second bit line driver further adjusts the second bit line from a reference voltage to a compensation voltage after the third bit line being floated.

4. The sensing amplifier as claimed in claim 3, if each of the bit lines being inhibited, corresponding bit line driver charging an inhibited bit line by a first voltage during a first time period, and floating the inhibited bit line during a second time period, wherein, the first time period and the second time period are arranged in sequential.

5. The sensing amplifier as claimed in claim 4, if each of the bit lines being FPW, corresponding bit line driver providing a reference voltage to a FPW bit line during the first time period and the second time period, and providing a FPW voltage to the FPW bit line during the third time period, wherein, the first time period, the second time period, and the third time period are arranged in sequential.

6. The sensing amplifier as claimed in claim 5, if each of the bit lines being programmed, corresponding bit line driver providing the reference voltage to a programmed bit line during the first time period, the second time period, and the third time period, and providing a compensation voltage to the programmed bit line during a fourth time period, wherein, the first tune period, the second time period, the third time period and the fourth time period are arranged in sequential.

7. The sensing amplifier as claimed in claim 6, wherein each of the bit line drivers comprises:

a first data controlled switch, coupled between the first voltage and an end, and controlled by a first data signal;

a bit line clamper, coupled between the end and corresponding bit line, and controlled by a first bit line control signal; and a second data controlled switch, coupled between the end and a reference voltage, and controlled by a second data signal.

8. The sensing amplifier as claimed in claim 7, each of the bit line drivers further comprises:

a reference voltage provider, coupled to the second data controlled switch, providing the reference voltage, wherein, the reference voltage provider adjusts the reference voltage to provide the compensation voltage to the programmed bit line during the fourth time period.

9. The sensing amplifier as claimed in claim 7, wherein, corresponding to the inhibited bit line, the first data controlled switch and the bit line clamper are turned on for passing the first voltage to charging the inhibited bit line during the first time period, and the bit line clamper is cut off for floating the inhibited bit line during the second time period.

10. The sensing amplifier as claimed in claim 7, wherein, corresponding to the FPW bit line, the second data controlled switch and the bit line clamper are turned on to provide the reference voltage to the FPW bit line during the first time period and the second time period, and the first data controlled switch and the bit line clamp are turned on to provide the FPW voltage to the FPW bit line during the third time period.

11. The sensing amplifier as claimed in claim 7, wherein, corresponding to the programmed bit line, the second data controlled switch and the bit line clamper are turned on to provide the reference voltage to the programmed bit line during the first time period, the second time period and the third time period, and the first data controlled switch and the bit lime clamp are turned on to provide the compensation voltage to the programmed bit line during the fourth time period.

12. The sensing amplifier as claimed in claim 7, wherein each of the bit line drivers further comprises:

an isolated switch, coupled between the corresponding bit line and the bit line clamper, and controlled by an isolation signal;

a bit line control switch, coupled between the first data controlled switch and the end, and controlled by a second bit line control signal; and a bypass transistor, coupled between the end and the second data controlled switch, and controlled by a pass control signal.

13. The sensing amplifier as claimed in claim 1, wherein the non-volatile memory is a NAND flash memory.

14. A method for bit line voltage compensation, adapted for a non-volatile memory, comprising:

setting a first bit line for a fast-pass-write (FPW) operation;

setting a second bit line for a program operation; and respectively adjusting a voltage level of the second bit line during the FPW operation, wherein, the first bit line is arranged adjacent to the second bit line.

15. The method as claimed in claim 14, wherein a step of adjusting voltage level of the second bit line during the FPW operation comprises:

adjusting the second bit line from a reference voltage to a compensation voltage, wherein the compensation voltage is determined according to a capacitance value between the first bit line and the second and third bit lines.

16. The method as claimed in claim 14, further comprising:

setting a third bit line which is arranged adjacent to the second bit line for an inhibited operation by floating the third bit line; and adjusting the voltage level of the second bit line from a reference voltage to a compensation voltage after the third bit line being floated.

17. The method as claimed in claim 16, step of setting the third bit line which is arranged adjacent to the second bit line for the inhibited operation by floating the third bit line comprising:

charging the third bit line by a first voltage during a first time period by a corresponding bit line driver; and floating the third bit line during a second time period by the corresponding bit line driver, wherein, the first time period and the second time period are arranged in sequential.

18. The method as claimed in claim 17, step of setting the first bit line for the FPW operation comprises:

providing a reference voltage to the first bit line during the first time period and the second time period; and providing a FPW voltage to the FPW bit line during the third time period, wherein, the first time period, the second time period, and the third time period are arranged in sequential.

19. The method as claimed in claim 18, step of setting the second bit line for the program operation comprises:

providing the reference voltage to the second bit line during the first time period, the second time period, and the third time period; and providing a compensation voltage to the programmed bit line during a fourth time period, wherein, the first time period, the second time period, the third time period and the fourth time period are arranged in sequential.

20. The method as claimed in claim 14, wherein the non-volatile memory is a NAND flash memory.

* * * * *